United States Patent [19]

Beinvogl et al.

[11] Patent Number: 4,658,496
[45] Date of Patent: Apr. 21, 1987

[54] METHOD FOR MANUFACTURING VLSI MOS-TRANSISTOR CIRCUITS

[75] Inventors: Willy Beinvogl; Gerhard Enders; Ernst-Guenter Mohr, all of Munich, Fed. Rep. of Germany

[73] Assignee: Siemens Aktiengesellschaft, Berlin and Munich, Fed. Rep. of Germany

[21] Appl. No.: 783,161

[22] Filed: Oct. 2, 1985

[30] Foreign Application Priority Data

Nov. 29, 1984 [DE] Fed. Rep. of Germany ....... 3443580

[51] Int. Cl.$^4$ .................. H01L 21/265; H01L 21/308
[52] U.S. Cl. .................................... 29/571; 29/576 B; 29/578; 148/1.5; 148/187; 148/DIG. 82; 148/DIG. 140; 156/643; 357/42; 357/91
[58] Field of Search ............... 29/571, 576 B, 578, 29/591; 148/1.5, 175, 187; 156/643; 357/42, 91

[56] References Cited

U.S. PATENT DOCUMENTS

| | | | |
|---|---|---|---|
| 3,699,646 | 10/1972 | Vadasz | 29/571 |
| 4,356,623 | 11/1982 | Hunter | 29/571 |
| 4,366,613 | 1/1983 | Ogura et al. | 29/571 |
| 4,478,679 | 10/1984 | Chang et al. | 29/591 |
| 4,488,351 | 12/1984 | Momose | 29/571 |
| 4,536,944 | 8/1985 | Bracco et al. | 29/571 |
| 4,566,175 | 1/1986 | Smayling et al. | 29/576 B |
| 4,569,122 | 2/1986 | Chan | 29/577 C |
| 4,577,391 | 3/1986 | Hsia et al. | 29/571 |

FOREIGN PATENT DOCUMENTS

WO 82/03945 11/1982 Fed. Rep. of Germany .

OTHER PUBLICATIONS

Murarka et al. IEEE-Jour. Solid St. Circuits, SC-15 (1980) 474.
Tsang et al., "Fabrication of High-Performance LDDFET'S With Oxide Sidwall-Spacer Technology, Citations IEEE Transactions, Apr. 1982.
Miyamoto et al., "A. 1.0um N-Well CMOS/ Bipolar Technology for VLSI Circuits", IEDM, vol. 83, pp. 63–66.
Dash et al., IBM Technical Disclosure Bulletin, vol. 24, No. 6 (Nov. 1981), p. 2863.

*Primary Examiner*—Upendra Roy

[57] ABSTRACT

A method for manufacturing VLSI MOS-transistor circuits involving the production of transistors by means of a spacer layer technique and ohmic contacts from the gate interconnect to the diffused regions of the substrate (thus providing buried contacts) both being simultaneously generated. Contact holes are provided at the desired location in the substrate before the deposition of the spacer layer occurs across the surface of the substrate. The spacer layer is simultaneously structured at the side walls of the gates and at the side walls of the interconnects which serve as connections. The contact hole region is doped at the same time as the source-/drain areas are provided by ion implantation. The combined manufacture of transistors using spacer technology and buried contacts makes it possible to manufacture MOS logic circuits and memory circuits with voltage stable transistors in high packing density.

11 Claims, 10 Drawing Figures

METHOD FOR MANUFACTURING VLSI MOS-TRANSISTOR CIRCUITS

BACKGROUND OF THE INVENTION

1. Field of the Invention

This invention relates to a method for manufacturing VLSI MOS-transistor circuits wherein the source/drain regions of n-channel transistors or p-channel transistors are produced by ion implantation, using the gate as an implantation mask. The source/drain ion implantation is shielded by an additional spacer layer which is generated at the gate edges, and ohmic contacts are produced at the same time between the gate interconnect serving as a lead and the diffused regions in the semiconductor substrates which constitute buried contacts.

2. Description of the Prior Art

In the development of finer and finer structural dimensions of transistors in MOS logic and memory circuits, the dielectric strength, and the reduction of parasitic effects such as caused by an overlap capacitance between the gate and the source/drain regions are becoming increasingly significant. One method for resolving the problem is referred to as the LDD (lightly doped drain) transistor such as disclosed, for example, in an article by P. I. Tsang et al. in IEEE Trans. El. Dev. ED 29 (1982) pages 590–596. It is well known to produce LDD transistors with a technique referred to as the spacer technique. The preferred spacer material is $SiO_2$ since it can be deposited conform by over steps, it electrically insulates, and can be etched to very precise dimensions. In the article by Tsang et al. the distance between the gate and the edges of the source/drain ion implantation is set over an oxide layer at the side wall of the transistor gate by an additionally deposited spacer oxide layer which is anisotropically etched before the source/drain ion implantation.

Another method utilizing a side wall spacer technique will be found in an article by I. Miyomoto et al. appearing in IEDM 83, pages 63–66. A spacer technique having a double layer of polysilicon and $SiO_2$ is employed for manufacturing CMOS bipolar transistor circuits. This has the advantage that the end point for the etching of the polysilicon layer is recognizable so that an attack on the $SiO_2$ is minium both on the field regions as well as the later diffused regions so that no damage of the single crystal substrate occurs. In contrast to $SiO_2$, back-etching is more difficult in this location because a dimensionally true imaging of the polysilicon thickness along the steps is difficult to obtain a chlorine-containing plasmas, probably due to the granular structure of the layer. A thin auxiliary layer composed, for example, of $SiO_2$ is used and the spacer structuring is undertaken by etching this double layer.

SUMMARY OF THE INVENTION

The present invention provides an MOS process of the type initially described wherein the ohmic contact between the gate interconnect and the diffusion regions in the silicon substrate, i.e., the buried contacts, which are required in many logic and memory circuits can be produced simultaneously with the LDD transistors utilizing a spacer technique. The contact can be made extremely low in resistance and space, and the resulting topography should be as flat as possible.

A buried contact is usually produced by opening a contact hole before the deposition of the gate interconnect layer. The contact hole itself can be doped either before the layer deposition or after by diffusion of the dopant, for example, from polysilicon. More specific details regarding buried contacts can be found in U.S. Pat. No. 3,699,646 and the IBM Technical Disclosure Bulletin Volume 24, No. 6, November 1981, pages 2863–2866.

The present invention achieves the objective of simultaneous manufacture of transistors in spacer technology and buried contacts in an integrated MOS circuit by providing contact holes at the desired location of the substrate before the surface-wide deposition of the spacer layer. Also, a spacer layer is provided at the side wall of the gate interconnect layer and is formed together with the structuring of the spacer layer at the side wall of the gate so that the contact hole regions in the semiconductor substrate and in the spacer layer are also doped in the subsequent formation of the source/drain regions. In accordance with the present invention, the spacer layer may be composed of a double layer, one of which is $SiO_2$ and the other of which may be polysilicon, a high melting point metal, or a silicide of a high melting point metal. The upper layer of this double layer, for example, $SiO_2$ or $Si_3N_4$ only performs an auxiliary function, namely that of enabling the precise generation of the conductive spacer layer. The conductive layer lying below the surface which represents the connection between the gate and the substrate in the region of the buried contact can be composed of polysilicon or of a metal silicide such as tantalum silicide. The gate interconnect itself can be composed of doped polysilicon, a silicide, a high melting point metal, or a double layer polysilicon/silicide. The combination of the gate interconnect and the spacer layer is such that an ohmic contact results. It is an advantage of the present invention that the doping of the spacer layer can take place simultaneously with the source/drain implantation.

As applied to the manufacture of an MOS transistor of the n-channel type with a shielded source/drain ion implantation and ohmic contact of the substrate, the method of the present invention may include the following steps. First, the active transistor regions are defined by generating field oxide regions in a semiconductor substrate, for example, by means of the so-called LOCOS technique. Next, a gate oxide is generated and the gate interconnect is formed with simultaneous structuring of the gate and of the connection to the substrate contact. Next, there is an $n^-$ ion implantation for producing a shallow, low concentration diffusion zone. An insulating layer is generated on the gate by deposition, for example, of an $SiO_2$ layer or by thermal oxidation of polysilicon. The desired contact hole is opened by removing the oxide layer and the gate oxide at the location after the photolithograhic process has been completed. A double layer which acts as a spacer layer is then deposited preferably consisting of a layer of polysilicon having a surface layer of $SiO_2$. The double layer spacer is defined such that the gate side walls and the side walls of the gate interconnect remain covered with this double layer. Then, an $n^+$ ion implantation is carried out for generating the source/drain regions and the diffused substrate region in the contact hole.

The present invention is also applicable to the manufacture of an integrated circuit of the CMOS type containing both n-channel transistors as well as p-channel transistors. In this form of the invention, an n-well is first generated in the p-doped substrate by ion implantation and subsequent diffusion of phosphorous ions while masking the remaining surface of the substrate. The active transistor regions are then defined by generating field oxide regions, for example, by means of the LOCOS technology after removal of the masking used in the previous step. Then, a gate oxide layer is generated and the gate interconnect is structured together with the connection leading to the substrate. An $n^-$ ion implantation then occurs, preferably with phosphorous ions, for producing a shallow low concentration diffusion zone in the n-well. An oxide layer is then generated on the gates by deposition of $SiO_2$ or by thermal oxidation of polysilicon. The desired contact holes are then opened by removing the oxide layer applied according to the previous step and the gate oxide after the required photolithography has been accomplished. A spacer layer is then applied and structured such that the gate side walls and the side walls of the connections composed of the gate interconnect remain covered with the spacer layer. Next, an $n^+$ or $p^{30}$ ion implantation occurs in the p-region of the substrate or in the n-well after suitable photoresist masking of the n-well or of the p-doped substrate region for generating the source/drain regions and the diffused substrate region in the contact hole of the n-channel or p-channel transistors. Finally, there is a high-temperature treatment for diffusing the implanted dopant ions into the substrate.

BRIEF DESCRIPTION OF THE DRAWINGS

Further details of the present invention will be apparent to those skilled in the art by reference to two exemplary embodiments in the drawings in which.

Figure 1:
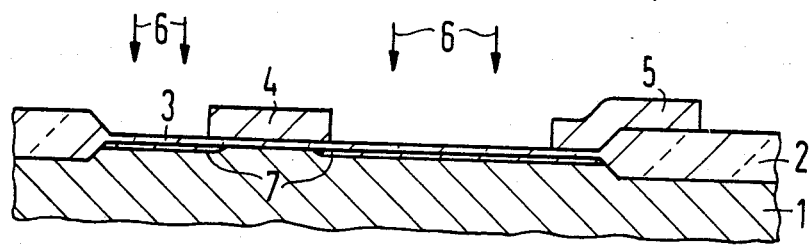
FIGS. 1 to 4 illustrate a process sequence for manufacturing n-channel MOS transistors using spacer technology with buried contacts.

The same reference characters have been applied to identical parts in all Figures. The process steps up to the structuring of the gate composed, for example, of polysilicon correspond to known process sequences, as does the finishing of the circuit after the production of the source/drain regions. For these reasons, these method steps will not be discussed in detail.

DESCRIPTION OF THE PREFERRED EMBODIMENTS

In FIG. 1, reference numeral 1 refers to a p-doped silicon substrate in which the active transistor zones are separated by field oxide regions 2 on which a gate oxide 3 is generated with a layer thickness of approximately 20 nm. An implantation with, for example, phosphorous ions as indicated by arrows 6 takes place at a dosage and energy level of $5 \times 10^{12}$ cm$^{-2}$ and 80 keV, respectively, to produce a shallow diffusion region 7 after simultaneous structuring of a gate electrode 4 composed of polysilicon and a gate interconnect layer 5 which serves as a connection.

Figure 2:
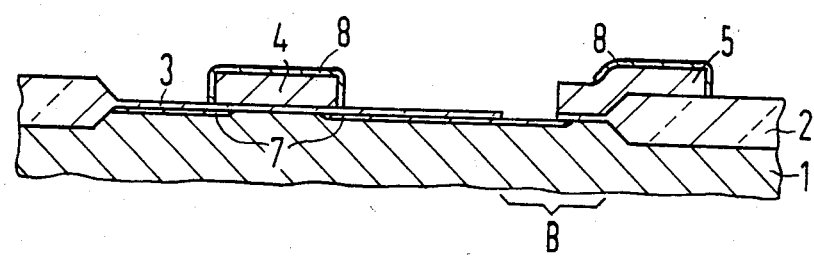

Referring to FIG. 2, the gate regions 4 and 5 are then surrounded with an insulating layer 8 composed, for example, of $SiO_2$ generated by thermal oxidation and regions B in which a buried contact is to be fashioned are subsequently uncovered with a photolithography/etching step.

Figure 3:
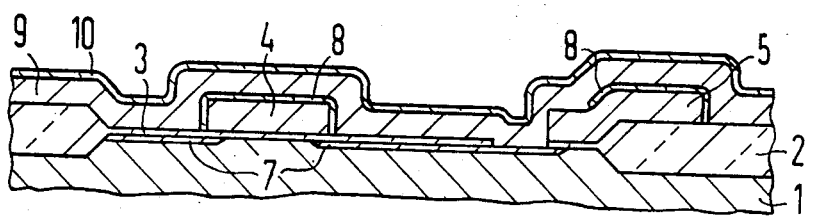

As shown in FIG. 3, the next step consists of a surface-wide deposition of spacer layers composed of double layers 9 and 10. The layer 9 may be composed, for example, of polysilicon which is doped or becomes doped from the gate interconnect 5. The upper layer 10 composed of $SiO_2$ serves as an auxiliary layer and can be removed at a later stage.

Figure 4:
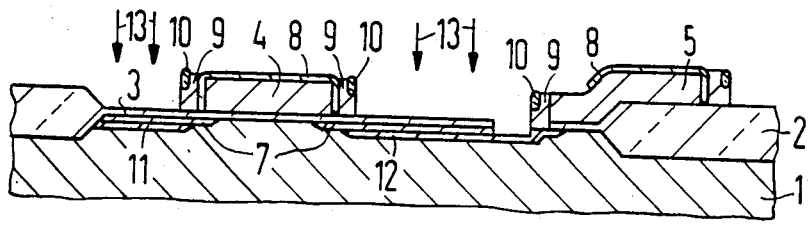

As shown in FIG. 4, after the spacer structuring has been accomplished, including the etching of the double layer 9, 10, the source/drain zones 11 and 12 are generated by means of an implantation containing arsenic ions as shown by the arrow 13 at a dosage and energy level of, for example, $6 \times 10^{15}$ cm$^{-2}$ and 100 keV.

As a result of the subsequent diffusion of the ion implantation, the diffused buried contacts occur next to the source/drain regions 11 and 12. More specific details of the structure will be found in FIGS. 9 and 10 which will be described subsequently.

The etching sequence in the production of the polysilicon/$SiO_2$ spacer layer occurs by means of reactive ion etching in two steps. In the first, trifluoro methane and oxygen at a pressure of 7 Pa (50 mTorr) are reacted on the surface at an etching rate of 50 nm/min for the $SiO_2$ layer 10. This is followed by treating with an atmosphere containing chlorine, for example, a mixture of chlorine and boron trichloride for etching the polysilicon layer 9.

In a manner analogous to the sequence described in FIGS. 1 through 4, the process can also be adapted to CMOS technology. In this case, the method of the invention is particularly advantageous because a great number of variants are presented, depending on whether only an n-channel transistor is to be fashioned as an LDD transistor or whether both n-channel transistors as well as p-channel transistors are to be produced. A further variation lies in the selection of the gate material wherein both a predominantly standard $n^+$ polysilicon or a policide or a silicide as well as high melting point metals can be employed.

A CMOS process having an n-well will be described below. Only the n-channel transistor is fashioned as an LDD transistor.

Figure 5:
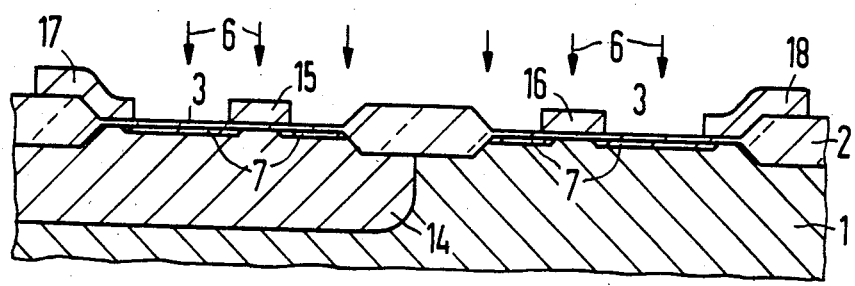
FIGS. 5 to 8, inclusive, illustrate a process sequence for manufacturing CMOS transistors.

Referring to FIG. 5, there is shown a p-doped substrate 1 having an n-well formation 14 therein, and including active transistor zones defined by the field oxide regions 2. Then, gate oxidation is carried out as described in connection with FIG. 1. The gates 15 and 16 and the gate interconnects 17 and 18 which serve as connections are then simultaneously structured. The implantation with arsenic or phosphorous ions for producing a shallow diffusion region 7 then occurs as described in conjunction with FIG. 1 and is shown by the arrows 6.

Figure 6:
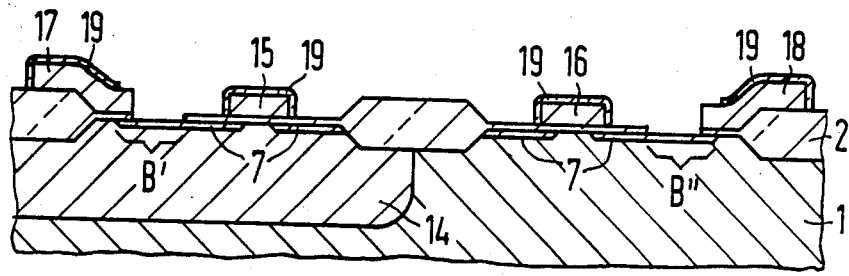

Referring to FIG. 6, after the $n^-$ implantation in the zones 6 and 7, the gate interconnects 15, 16, 17 and 18 are surrounded with an insulating layer 19 composed, for example, of $SiO_2$ in the manner described in FIG. 2. Also, the contact hole regions B' and B" are opened for forming the buried contacts.

Figure 7:
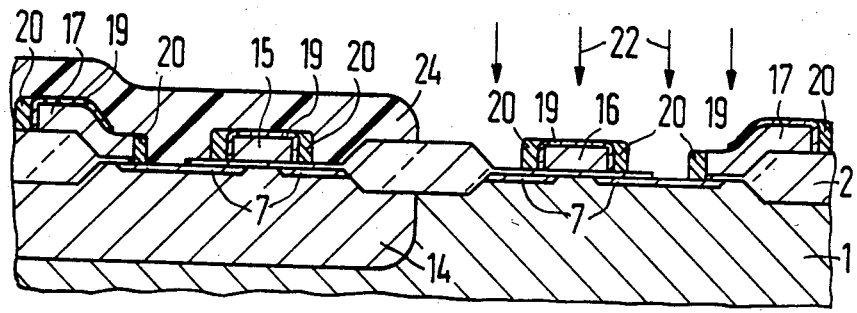

In FIG. 7, which is analogous to the method described in FIG. 3, a spacer layer structure 20 composed, for example, of tantalum disilicide ($TaSi_2$) is produced by chemical vapor deposition.

The anisotropic etching of tantalum silicide is possible in various forms. For example, a reactive ion etching in $SF_6$ can take place in the pressure range of a few Pascal. Or, in a similar pressure range, the etching can take place in a mixture of boron trichloride and chlorine, the boron trichloride additive functioning to eliminate surface films which otherwise prevent a uniform etching attack of the silicide. In general, the layer composition is not exactly stoichiometric (i.e., for example, 33.3% Ta in the case of TaSi$_2$) after the deposition by evaporation, sputtering or in a chemical vapor deposition process. In order to avoid material migration effects in the region of the buried contacts, the silicide formation should be followed by an appropriate high temperature treatment after the production of the spacer layer.

The source/drain ion implantations 22 and 23 with arsenic ions and boron ions respectively are carried out with respective regions being covered with photoresist maskings 24 and 25. In FIG. 7, the arsenic ion implantation as indicated by the arrows 22 is in the process of occurring, and the n-well region 14 is covered with the photoresist mask 24. The n+-doped areas are formed as source/drain regions. For purposes of clarity, these are not shown.

Figure 8:
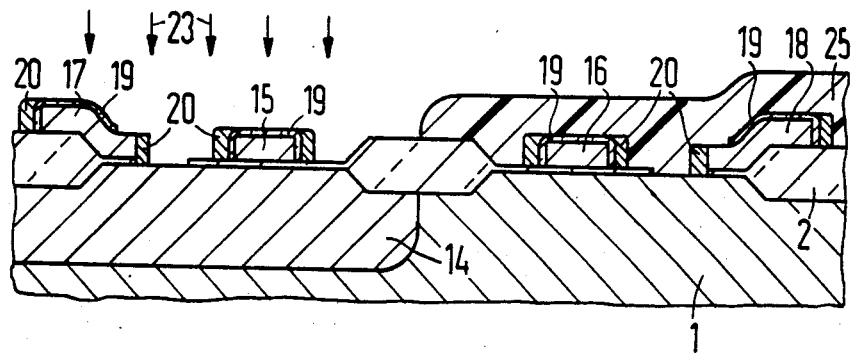

In FIG. 8, the source/drain ion implantation with boron is illustrated by means of arrows 23. The implantation mask 25 protects the regions already implanted with a high arsenic dosage against compensation. There are p+-doped regions in the n-well 4 which serve as source/drain terminals. For purposes of clarity, these have not been shown.

The uncovered spacer layers are co-doped during the source/drain ion implantations as indicated by the arrows 22 and 23. The dopant in the regions B' and B" of the buried contacts is diffused into the substrate 1 by means of a high temperature step in the vicinity of 900° C. and forms an ohmic contact with the diffusion region. This high temperature step can be carried out simultaneously with the activation of the high dosage implantations indicated by the arrows 22 and 23.

Figure 9:
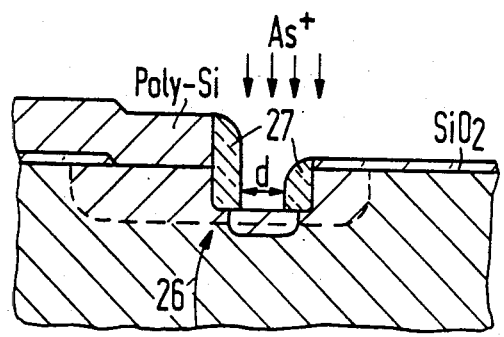
FIG. 9 illustrates a traditional buried contact.
Figure 10:
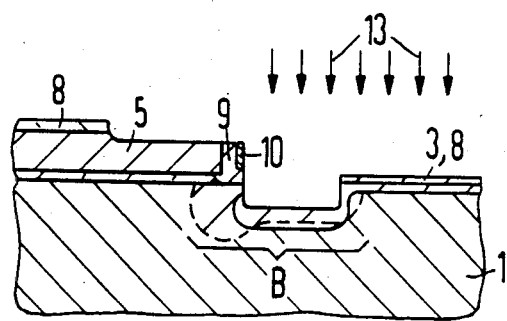
FIG. 10 illustrates a transistor produced according to the present invention.

A comparison of FIGS. 9 and 10 shows the difference between a buried contact which has been manufactured in accordance with the teaching of the present invention (FIG. 10) and a traditional buried contact using spacer technology (FIG. 9). Whereas the overlap is critical in the case of the traditional buried contact as shown by the arrow 26 because the distance d of the side wall insulation 27 composed of SiO$_2$ is dependent on adjustment tolerances, this problem does not exist in the arrangement of the present invention. The dashed lines show the front of the dopant diffused out of the polysilicon in FIG. 9 or, respectively, out of the spacer. The solid line shows the course of the regions in the silicon substrate 1 or in the n-well 14 which are generated by the arsenic ion implantation and the subsequent diffusion. Under normal conditions, the conductive spacer layers can be removed after the implantations have been accomplished by using a mask which covers the buried contact regions.

The following advantages over known processes are achieved by the methods of the present invention:

1. The buried contact can be etched before the deposition of the spacer layer.

2. The gate oxide regions under the gates are protected in the photo-etching technique for the buried contact, since the buried contact is opened after the production of the gate interconnect.

3. The spacer etching can be selectively conducted on thick and thin oxide regions because polysilicon can be etched highly selectively with respect to SiO$_2$. In contrast, there is no etching stop for spacers of SiO$_2$.

4. The polysilicon can be doped with arsenic in order to achieve a low dopant penetration depth in the buried contact. In the standard version of the buried contact, this is problematical since arsenic diffuses through thin SiO$_2$ layers.

5. The incipient etching of the substrate in the buried contact can be minimized, since it is possible to recognize the end point of the etching and over-etching is not the problem. The extremely difficult etching problem which is provided in a double polysilicon gate process when structuring the second polysilicon level in the case of a buried contact is therefore distributed over two process steps.

6. The connection of the diffusion regions in the buried contact is less critical than in the case of an SiO$_2$ spacer as shown in FIG. 9 since the spacer, as shown in FIG. 10, itself serves as a dopant source and no shadowing of the source/drain ion implantation occurs in the etched region.

7. The thickness of the insulating layer between the polysilicon spacer and the gate interconnect essentially defines the corresponding parasitic capacitances.

A further advantage is that a direct ohmic connection between n+ and p+ regions can be produced when the gate material is composed of a silicide or policide. Such a wiring possibility is very space-saving and is used to advantage for static RAMs (6-transistor cell).

It will be evident that various modifications can be made to the described embodiments without departing from the scope of the present invention.

We claim as our invention:

1. In a method for the manufacture of VLSI MOS-transistor circuits on a semiconductor substrate wherein source/drain regions of n-channel or p-channel transistors are provided by ion implantation using the gate as an implantation mask, the side walls of said gate having spacer layers which act as implantation barriers, while simultaneously generating buried contacts between a gate interconnect and the diffused regions in the semiconductor substrate, the improvement which comprises:
   etching contact holes in said substrate prior to deposition of said spacer layers,
   depositing and back-etching a spacer layer on the side wall of said gate interconnect and at the side wall of said gate, and
   thereafter diffusing dopant into said contact holes and said spacer layers while generating source/drain regions in said substrate.

2. A method according to claim 1 wherein said spacer layers are dual layers, one of which is SiO$_2$ and the other of which is polysilicone, a high melting point metal, or a silicide of a refractory metal.

3. A method according to claim 1 wherein said spacer layers are composed of tantalum silicide or a refractory metal.

4. A method according to claim 1 wherein said spacer layer contains a dopant which corresponds to the composition of the gate interconnect.

5. A method according to claim 2 which includes the step of removing the SiO$_2$ layer after said diffusing.

6. A method for forming an n-MOS transistor of the n-channel type having shielded source/drain ion implantation and ohmic contact to a semiconductor substrate which comprises the following steps:
   (a) defining active transistor regions in said substrate by generating field oxide regions in said substrate, (b) generating oxides over the gate portions of said transistor regions, (c) depositing gate interconnects while simultaneously structuring the gate and connections to the substrate contact, (d) implanting n⁻ ions to produce a shallow low concentration diffusion zone, (e) generating an insulating layer of SiO₂ on the gate, (f) providing contact holes in predetermined locations by removing the oxide layer applied in step (e) and the gate oxide applied in step (b), (g) depositing a dual spacer layer, one layer of which consists of SiO₂ and the other of polysilicon, a refractory metal, or a silicide of a refractory metal, (h) depositing said spacer layer such that the side walls of the gate and the side walls of the gate interconnect are covered with the double layer, and (i) implanting n+ ions for generating the source/drain regions and the diffused substrate region in the contact holes.

7. A method according to claim 6 wherein the structuring of the double spacer layer occurs in two steps, in the first of which the SiO₂ layer is subjected to reactive ion etching in trifluoro methane and oxygen, and in the second of which the other layer is subjected to reactive ion etching in an atmosphere containing chlorine and boron trichloride.

8. A method for the manufacturing of a CMOS integrated circuit containing n-channel transistors and p-channel transistors comprising the following steps:

(a) generating an n-well in a p-doped substrate by ion implantation and subsequent diffusion of phosphorous ions, (b) generating field oxide regions to define active transistor regions in the substrate, (c) generating a gate oxide layer, (d) providing a gate interconnect and gates together with connections to the substrate, (e) implanting n⁻ ions to produce a shallow low concentration diffusion zone in the n-well, (f) forming a layer of SiO₂ on the gates, (g) providing contact holes in predetermined positions by removing the oxide layer applied in step (f) and the gate oxide applied in step (c), (h) depositing a spacer layer and structuring said spacer layer such that the gate side walls and the side walls of the connections feeders composed of the gate interconnect remain covered with the spacer layer, (i) implanting n+ or p+ ions in the p-region of the substrate or the n-well to thereby generate source/drain regions and a diffused substrate region in the contact holes of the n-channel or p-channel transistors, and (j) subjecting the thus formed semiconductor to a high temperature treatment for diffusing in the implanted dopant ions.

9. A method according to claim 8 wherein said spacer layer consists of tantalum disilicide deposited from the vapor phase by chemical vapor deposition.

10. A method according to claim 9 wherein the structuring of the spacer layer occurs by means of reactive ion etching in sulfur hexafluoride.

11. A method according to claim 9 wherein the structuring is carried out by means of reactive ion etching in a mixture of boron trichloride and chlorine at a pressure range of from 5 to 10 Pa.

* * * * *